United States Patent
Ali

(10) Patent No.: US 10,043,756 B2
(45) Date of Patent: *Aug. 7, 2018

(54) LOCAL PHASE CORRECTION

(71) Applicant: INPHI CORPORATION, Santa Clara, CA (US)

(72) Inventor: Mohammed Ershad Ali, Westlake Village, CA (US)

(73) Assignee: INPHI CORPORATION, Santa Clara, CA (US)

( * ) Notice: Subject to any disclaimer, the term of this patent is extended or adjusted under 35 U.S.C. 154(b) by 51 days.

This patent is subject to a terminal disclaimer.

(21) Appl. No.: 15/285,420

(22) Filed: Oct. 4, 2016

(65) Prior Publication Data

US 2017/0026065 A1 Jan. 26, 2017

Related U.S. Application Data

(63) Continuation of application No. 14/592,743, filed on Jan. 8, 2015, now Pat. No. 9,461,677.

(51) Int. Cl.
*H04K 1/02* (2006.01)
*H01L 23/538* (2006.01)

(52) U.S. Cl.
CPC .............................. *H01L 23/5386* (2013.01)

(58) Field of Classification Search
CPC ............ H01L 23/5386; H01L 27/0207; H04B 1/0475
USPC .......... 375/219, 224, 295, 296, 316; 333/33, 333/246, 109, 128

See application file for complete search history.

(56) References Cited

U.S. PATENT DOCUMENTS

| | | | |
|---|---|---|---|
| 5,592,612 A | 1/1997 | Birk | |
| 6,128,094 A | 10/2000 | Smith | |
| 6,400,621 B2 | 6/2002 | Hidaka et al. | |
| 6,538,528 B2 * | 3/2003 | Louzir | H01P 1/184 333/128 |
| 6,542,956 B1 | 4/2003 | Lee et al. | |
| 6,993,701 B2 | 1/2006 | Corbett et al. | |
| 7,656,727 B2 | 2/2010 | Thayer | |
| 7,990,746 B2 | 8/2011 | Rajan | |
| 8,325,554 B2 | 12/2012 | Sweere et al. | |
| 8,687,451 B2 | 4/2014 | Wang | |

(Continued)

OTHER PUBLICATIONS

Office Action for U.S. Appl. No. 13/653,373, dated Mar. 27, 2014.

(Continued)

*Primary Examiner* — Dhaval Patel
(74) *Attorney, Agent, or Firm* — Richard T. Ogawa; Ogawa P.C.

(57) ABSTRACT

The present invention is directed to integrated circuits and methods thereof. More specifically, embodiments of the present invention provide a local correction for bending communication line pairs. In an IC package, a pair of communication lines is used to provide a physical link for data communication between two or more components. At regions where the pair of communication lines is bent, the inner bend line is extended in length and shaped to match the length of the outer bend line while preserving integrity of its signal propagation characteristics, thereby providing local phase correction. There are other embodiments as well.

20 Claims, 9 Drawing Sheets

(56) References Cited

U.S. PATENT DOCUMENTS

| | | | |
|---|---|---|---|
| 2004/0123029 A1 | 6/2004 | Dalal et al. |
| 2006/0200697 A1 | 9/2006 | Ito |
| 2008/0104290 A1 | 5/2008 | Cowell et al. |
| 2008/0183959 A1 | 7/2008 | Pelley et al. |
| 2009/0141558 A1 | 6/2009 | Sarin et al. |
| 2009/0300259 A1 | 12/2009 | Luo et al. |
| 2010/0005212 A1 | 1/2010 | Gower et al. |
| 2010/0162037 A1 | 6/2010 | Maule et al. |
| 2010/0199125 A1 | 8/2010 | Reche |
| 2010/0274952 A1 | 10/2010 | Lee |
| 2011/0072200 A1 | 3/2011 | Lee et al. |
| 2011/0125990 A1 | 5/2011 | Khosravi et al. |
| 2011/0170329 A1 | 7/2011 | Kang |
| 2012/0151294 A1 | 6/2012 | Yoo et al. |
| 2012/0243299 A1 | 9/2012 | Shau |
| 2012/0257459 A1 | 10/2012 | Berke |
| 2012/0297231 A1 | 11/2012 | Qawami et al. |
| 2013/0060996 A1 | 3/2013 | Berke |

OTHER PUBLICATIONS

Notice of Allowance for U.S. Appl. No. 13/558,332, dated Feb. 25, 2014.
Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 16, 2014.
Office Action for U.S. Appl. No. 13/791,807, dated May 29, 2014.
Office Action for U.S. Appl. No. 14/178,241, dated Jun. 27, 2014.

\* cited by examiner

LOCAL PHASE CORRECTION

CROSS-REFERENCES TO RELATED APPLICATIONS

The present application is a continuation of and claims priority to U.S. application Ser. No. 14/592,743 filed Jan. 8, 2015, the contents of which are hereby incorporated by reference for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits and methods thereof.

Over the last few decades, integrated circuits (IC) and applications thereof developed and grew at a rapid pace. One of the challenges has been to fit a large number of components into IC packages and for these components to communicate with one another at high speed. High speed transmission lines are usually involved in high speed data communication. For example, between two IC components within an IC package, one or more data lines are used for data communication between these two IC components. In many applications, communication lines are arranged in pair to provide physical link for data communication. For example, data communication may take place between the two IC components within the same IC package, and a pair of communication lines may operate in differential mode or in common mode.

There are various types of existing techniques for providing data communication. However, as described below, they have been inadequate. Therefore, improved systems and methods for data communication are desired.

BRIEF SUMMARY OF THE INVENTION

The present invention is directed to integrated circuits and methods thereof. More specifically, embodiments of the present invention provide a local correction for bending communication line pairs. In an IC package, a pair of communication lines is used to provide a physical link for data communication between two or more components. At regions where the pair of communication lines is bent, the inner bend line is extended in length and shaped to match the length of the outer bend line while preserving integrity of its signal propagation characteristics, thereby providing local phase correction. There are other embodiments as well.

According to an embodiment, the present invention provides an integrated circuit device, which includes a first component. The device also includes a second component. The device additionally includes a pair of communication lines connecting the first component and the second component. The pair of communication lines includes a first line and a second line. The first component is configured to send signal to the second component at a data rate of least 1 Gbps. The device also includes a first bend region on a path of the pair of communication lines. The first line has a first outer bend section and the second line has a first inner bend section at the first bend region. The first inner bend region is shaped to match a first length of the first outer bend region. The first outer bend region is associated with a first phase. The first outer bend region is associated with a second phase. The first phase is matched with the second phase.

According to another embodiment, the present invention provides an integrated circuit device, which includes a first component and a second component. The device also includes a pair of communication lines connecting the first component and the second component. The pair of communication lines includes a first line and a second line. The device further includes a first bend region on a path of the pair of communication lines. The first line includes a first outer bend section and the second line has a first inner bend section at the first bend region. The first inner bend region is shaped to match a first length of the first outer bend region. The pair of communication lines is characterized by an insertion loss of less than 2 dB at the first bend region. The first inner bend region is shaped to match a first length of the first outer bend region. The first outer bend region is associated with a first phase. The first outer bend region is associated with a second phase. The first phase is matched with the second phase.

According to yet another embodiment, the present invention provides an integrated circuit device that includes a first component and a second component. The device includes a pair of communication lines connecting the first component and the second component. The pair of communication lines includes a first line and a second line. The first line and the second line are separated by more than 1 micron. The device further includes a first bend region on a path of the pair of communication lines. The first line includes a first outer bend section and the second line has a first inner bend section at the first bend region. The first inner bend region is shaped to match a first length of the first outer bend region. The first inner bend region is shaped to match a first length of the first outer bend region. The first outer bend region is associated with a first phase. The first outer bend region is associated with a second phase. The first phase is matched with the second phase.

It is to be appreciated that embodiments of the present invention provide many advantages over conventional techniques. Among other things, by matching the length of communication lines at bend regions, phase errors that are typically associated with length mismatch is greatly reduced, with minimal introduction of mode conversion. Through reduction of phase errors, signal degradation in coupled line bends is minimized and/or eliminated, as demonstrated by actual performance measurements explained below. In addition, embodiments of the present invention are compatible with existing systems and methods thereof, and thus can be easily implemented. There are other benefits as well.

DETAILED DESCRIPTION OF THE INVENTION

Figure 1:
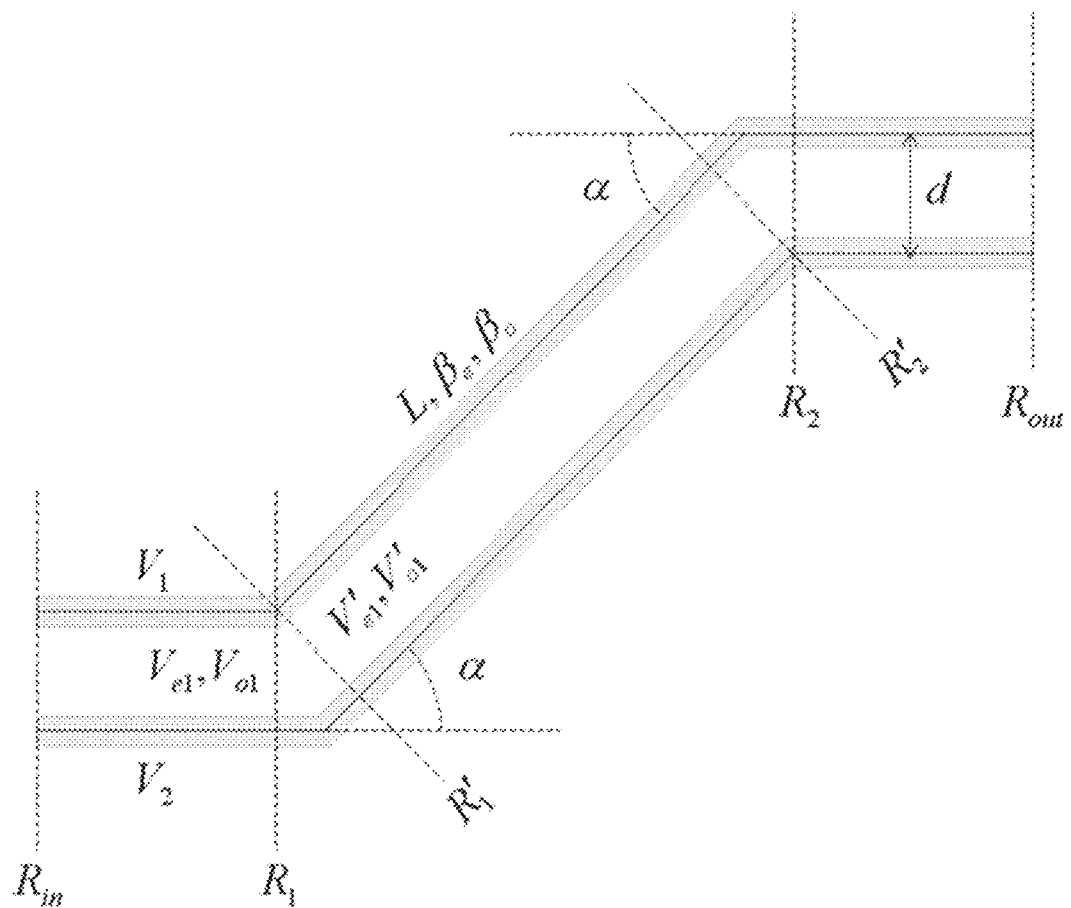
FIG. 1 is a simplified diagram illustrating a structure consisting of a length of coupled lines with two bends.

The present invention is directed to integrated circuits and methods thereof. More specifically, embodiments of the present invention provide a local correction for bending communication line pairs. In an IC package, a pair of communication lines is used to provide a physical link for data communication between two or more components. At regions where the pair of communication lines is bent, the inner bend line is extended in length and shaped to match the length of the outer bend line while preserving integrity of its signal propagation characteristics, thereby providing local phase correction. There are other embodiments as well.

Raw signaling speeds in both wired and wireless communication networks have been steadily increasing to meet unrelenting demands for higher data bandwidth and throughput. As a result, high speed transmission lines are becoming essential in all levels of interconnection in a system, both from one communication device to another and among components of a single device. Of particular importance are coupled transmission lines used as differential lines which are common in today's high speed systems, as they provide higher bandwidth and better immunity from noise and crosstalk. To achieve optimal performance with this type of differential lines, careful attention needs to be paid to every details of component placement and signal routing from early on in the design cycle. In a densely populated system board or component package or integrated circuit chip, turns and bends of signal lines are unavoidable. Often, these turns and bends would limit the bandwidth performance of a system employing coupled transmission lines.

Typically, coupled transmission lines support two modes of propagation, namely differential (odd) mode and common (even) mode. When a uniform coupled transmission line bends, conversion from one mode to another would take place in general. A purely differential mode before the bend will be transformed into a mixed mode, which is partly differential and partly common mode, after the bend. In a differential system, common mode is undesirable. Not only it takes energy away from the desired differential mode increasing the insertion loss as such, it also causes crosstalk, noise and electromagnetic interference.

In order to avoid bend related signal integrity issues in a differential channel, certain solutions have been proposed. In various conventional designs, critical signal paths are designed to be free of bends, i.e., routing them in straight lines. However this is often not possible as the signal lines have to stay clear of many keep-out zones typically found in interface, fan out and connector access areas on boards and substrates. For signals that continue in the same direction, bends occur in pairs. If the coupled lines do not have modal dispersion, the bends in a pair compensate each other producing only minimal effects on signal propagation. However if the coupled lines exhibit modal dispersion, the pair would no longer be fully compensating in nature and can cause significant deterioration of signals. For signals that do not continue in the same direction, some bends would remain uncompensated. Therefore for a method to be universally effective in mitigating bend effects, it has to locally compensate each bend. A number of such schemes have been recently demonstrated to improve differential bend performance. However there are practical challenges in implementing these methods in real systems.

It is thus to be appreciated that embodiments of the present invention provide a novel and practical local phase correction method that mitigates detrimental mode conversion in a coupled line bend. The working principle and effectiveness of the method are illustrated below first based on a simplified theory of mode conversion in single and double bends. Exemplary embodiments are also described, which is demonstrated by experimental validation of full wave electromagnetic simulations and analytically computed results.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Embodiments of the present invention provides local phase correction methods that effectively mitigate mode conversion in coupled transmission line bends, which leads to significant improvement in their high-speed performance. In various implementations, the present invention provides an improvement of up to more than 5 dB against signal loss and up to more than 16 dB in mode conversion at 50 GHz operating conditions. In addition, good correlation has been established among analytical predictions, full-wave electromagnetic simulations and measurements.

Raw signaling speeds in both wired and wireless communication networks have been steadily increasing to meet unrelenting demands for higher data bandwidth and throughput. As a result, high speed transmission lines are becoming essential in all levels of interconnection in a system. Of particular importance are coupled transmission lines used as differential lines which are most common in today's high speed systems, as they provide high bandwidth and immunity from noise and crosstalk. In order to achieve optimal performance with differential lines, careful attention needs to be paid to details of component placement and signal routing from early on in the design cycle. In a densely populated system board, component package, or integrated circuit chip, turns and bends of signal lines are unavoidable. These turns and bends would eventually limit the bandwidth performance of a system employing coupled transmission lines.

Typically, coupled transmission lines support two modes of propagation, namely differential (odd) mode and common (even) mode. When a uniform coupled transmission line bends, conversion from one mode to another is inevitable. A purely differential mode before the bend will be transformed into a mixed mode, partly differential and partly common mode, after the bend. In a differential system, common mode is undesirable. Not only it takes energy away from the desired differential mode increasing the insertion loss as such, it also causes crosstalk, noise and electromagnetic interference. As explained above, existing techniques addressing issues related to bending transmission lines.

It is to be appreciated that embodiments of the present invention provides local phase correction technique that mitigates detrimental mode conversion in a coupled line bend. The working principle and effectiveness of the technique will be illustrated first based on a simplified theory of mode conversion in single and double bends. An exemplary implementation is described to provide demonstration, and the advantages are illustrated by experimental validation of full wave electromagnetic simulations and analytically computed results.

To show how mode conversion and associated signal degradation occur in coupled line bends, a theory is presented here with some simplifying assumptions. FIG. 1 is a simplified diagram illustrating a structure consisting of a length of coupled lines with two bends, which is often encountered in routing of high speed signal lines. The entire length in FIG. 1 is divided into three segments of uniformly coupled lines, between reference planes $R_{in}$ and $R_1$, $R_1'$ and $R_2'$, $R_2$ and $R_{out}$. It is assumed that signal propagates in these uniform segments either as odd mode or even mode, or as a linear combination of them. In the regions between $R_1$ and $R_1'$, and between $R_2'$ and $R_2$, only one of the constituent lines have non-zero lengths. This asymmetry causes intra-pair skew or equivalently excess phase in the line having the extra length. Multiplying the extra length by a phase constant, the excess phase $\phi$ in a single bend can be expressed as:

$$\phi = \frac{4\pi f k d}{c} \tan\frac{\alpha}{2} \quad (1)$$

Where f is frequency, d is the center-to-center distance between the lines or pitch, c is speed of light, $\alpha$ is the angle of the bend, and k is equivalent to an effective index of refraction that is a function of the propagation constants of the coupled lines.

Consider the odd mode excitation at the input in FIG. 1. The mode purity is maintained up to $R_1$ making terminal voltages equal and opposite in polarity there, i.e., $V_1=-V_2=V$. This is equivalent to the condition $V_{o1}=V$ and $V_{e1}=0$, where $V_{o1}$ and $V_{e1}$ are even and odd mode voltages respectively. Although there is no even mode before the bend, the excess phase in the bend produces some even mode, $V_{e1}'$ on the right of $R_1'$ at the cost of reduced odd mode $V_{o1}'$:

$$V_{e1}' = \frac{V}{2}(1-e^{-j\phi}), V_{o1}' = \frac{V}{2}(1+e^{-j\phi}) \quad (2)$$

So the desired odd mode suffers insertion loss $IL_S$, and an undesired even mode of magnitude $C_S$ gets excited due to mode conversion induced by excess phase in the bend. $IL_S$ and $C_S$ can be expressed in dB as:

$$IL_S = 20\log_{10}\left|\cos\frac{\phi}{2}\right|, C_S = 20\log_{10}\left|\sin\frac{\phi}{2}\right| \quad (3)$$

The odd and even modes now propagate in segment 2 from $R_1'$ to $R_2'$ with their respective propagation constants, $\beta_o$ and $\beta_e$. Each of these modes experiences insertion loss and mode conversion as it passes through the second bend. Cascading the effects of the first bend, mixed mode propagation in segment 2 and the second bend, the total insertion loss of desired odd mode, $IL_T$ and mode conversion to even mode $C_T$ in dB can be determined as:

$$IL_T = 10\log_{10}\left(\cos^2\frac{\Delta\beta L}{2} + \cos^2\phi\sin^2\frac{\Delta\beta L}{2}\right) \quad (4)$$

$$C_T = 20\log_{10}\left|\sin\phi\sin\frac{\Delta\beta L}{2}\right| \quad (5)$$

Where L is the length of segment 2, and $\Delta\beta=\beta_e-\beta_o$ represents modal dispersion.

Starting with even mode excitation at the input, it can be shown that Equations (3)-(5) also hold in same forms. Therefore, $IL_S$ and $IL_T$ above represent the insertion loss of launched mode, odd or even. Variables $C_S$ and $C_T$ represent the conversion to the other mode. For mixed mode excitation, each launched mode can be treated separately and then superposed to obtain total insertion loss and mode conversion.

Figure 2:
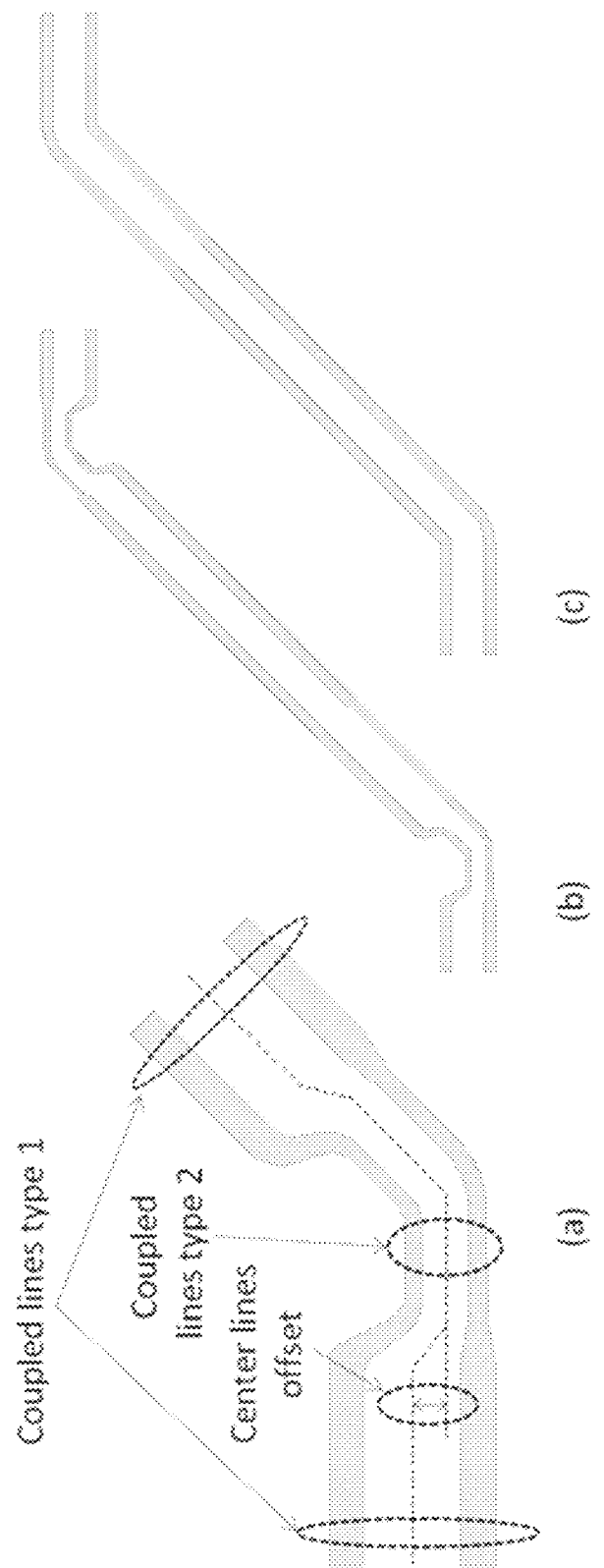
FIG. 2 illustrates techniques for providing phase correction for bends of coupled lines according to embodiments of the present invention.

FIG. 2 illustrates techniques for providing phase correction for bends of coupled lines according to embodiments of the present invention. More specifically, FIG. 2 (a) shows a local phase correction method in coupled line bends. FIG. 2 (b) shows coupled line with two phase corrected bends. FIG. 2(c) shows coupled line with regular bends having no phase correction. This diagram is merely an example, which should not unduly limit the scope of the claims. One of ordinary skill in the art would recognize many variations, alternatives, and modifications. Several observations are worth noting from Equations (3)-(5). First, for coupled lines with no bends, $\phi=0$ and the launched mode suffers no insertion loss (0 dB) and no mode conversion (i.e., $-\infty$ dB). Second, for a single bend there would always be some insertion loss and mode conversion and their magnitude is a function of the pitch of the lines. Third, for a pair of bends separated by a uniform section of coupled lines as illustrated in FIG. 1, if there is no modal dispersion (i.e., $\Delta\beta=0$), signal suffers no insertion loss or degradation due to the bends, as the bends are compensating each other. Fourth, if modal dispersion exists, even for compensating bends, there would be insertion loss and modal conversion and furthermore they would vary as a function of separation between the two bends. Last, both insertion loss and modal conversion are frequency dependent.

In the above analysis, impedance discontinuity at the bends and multiple reflections in the lines as a result of that are ignored. In addition, the odd and even modes are assumed to be perfectly terminated at both input and output ends. These are not too restrictive assumptions as a good design would minimize impedance discontinuity at the bends and provide good terminations for all modes.

A strategy to mitigate mode conversion needs to provide a means to eliminate, cancel or minimize the excess phase $\phi$ at the bends explained earlier. One of the ways to minimize $\phi$ would be to use much smaller d (i.e., to use strongly coupled lines at the bends), since it leads to smaller $\phi$ according to Equation (1). However this approach requires a very small value of d and a long impedance matching taper, severely limiting its use in practical systems.

It is thus to be appreciated that embodiments of the present invention provides techniques and systems thereof for improving communication lines with bends. An exemplary embodiment of the present invention is illustrated in FIG. 2(a). More specifically, FIG. 2(a) illustrates that phase correction can be provided by modifying the construction of the coupled line in the bend area in a way such that physical lengths of the inner and outer lines are approximately equal. It is to be appreciated that the modification results in a narrower coupled line segment in the bend center with short transition areas on both sides connecting to incoming and outgoing lines. As can be seen in FIG. 2(a), the coupled line segment is placed slightly offset outward from the center line. This arrangement allows longer lengths for the inner line in the transition areas. By adjusting the offset, the lengths of the lines can be equalized, leading to a net zero excess phase. Although the reduced d in the bend area contributes to some degree to lower the excess phase, the majority of the correction comes from the introduction of the extra length of the inner line. The change in the shape of the line as illustrated in FIG. 2(a) introduces a slight change in line impedance. However, this impedance discontinuity is not too large, and thus it does not need impedance matching section(s). The modified bend remains compact, its size being very similar to that of the original one. It is to be appreciated that by judiciously choosing the parameters of the coupled lines as well as the shape of the small transition areas, embodiments of the present invention provide good performance for coupled communication lines with bends.

As mentioned above, embodiments of the present invention can be utilized in designing and manufacturing of integrated circuits. For example, the phase correction scheme described above can have a variety of implementations based on substrate or board technology used, dielectric and metal stack-up, material properties, fabrication capabilities and other implementation characteristics.

FIG. 2(b) shows lines with corrected bends and FIG. 2(c) shows uncorrected bends, both of which involving a single layer dielectric, with two metal layers, top and bottom, that was used to construct the coupled line and the bends. In FIGS. 2(b) and 2(c), only top metal patterns are shown. For example, the bottom metal is a uniform pattern that serves as the ground plane for the coupled lines. Except for the bends, both types of lines have substantially identical line widths and spacing with total lengths being approximately equal.

To illustrate the effectiveness of the local bend correction, a simulation is provided for the purpose of demonstration. Among other things, the coupled lines are analyzed as 4-port three dimensional structures using full wave electromagnetic simulations. To provide an example, a finite element based commercial software tool is used for simulation. A frequency sweep from DC to 50 GHz is performed and results are obtained from the tool in the form of terminal scattering parameters. The scattering parameters are subsequently post-processed in a circuit simulator to first generate mixed mode scattering parameters and then compute insertion loss and mode conversion. Below, results for the input differential excitation are presented.

Figure 3:
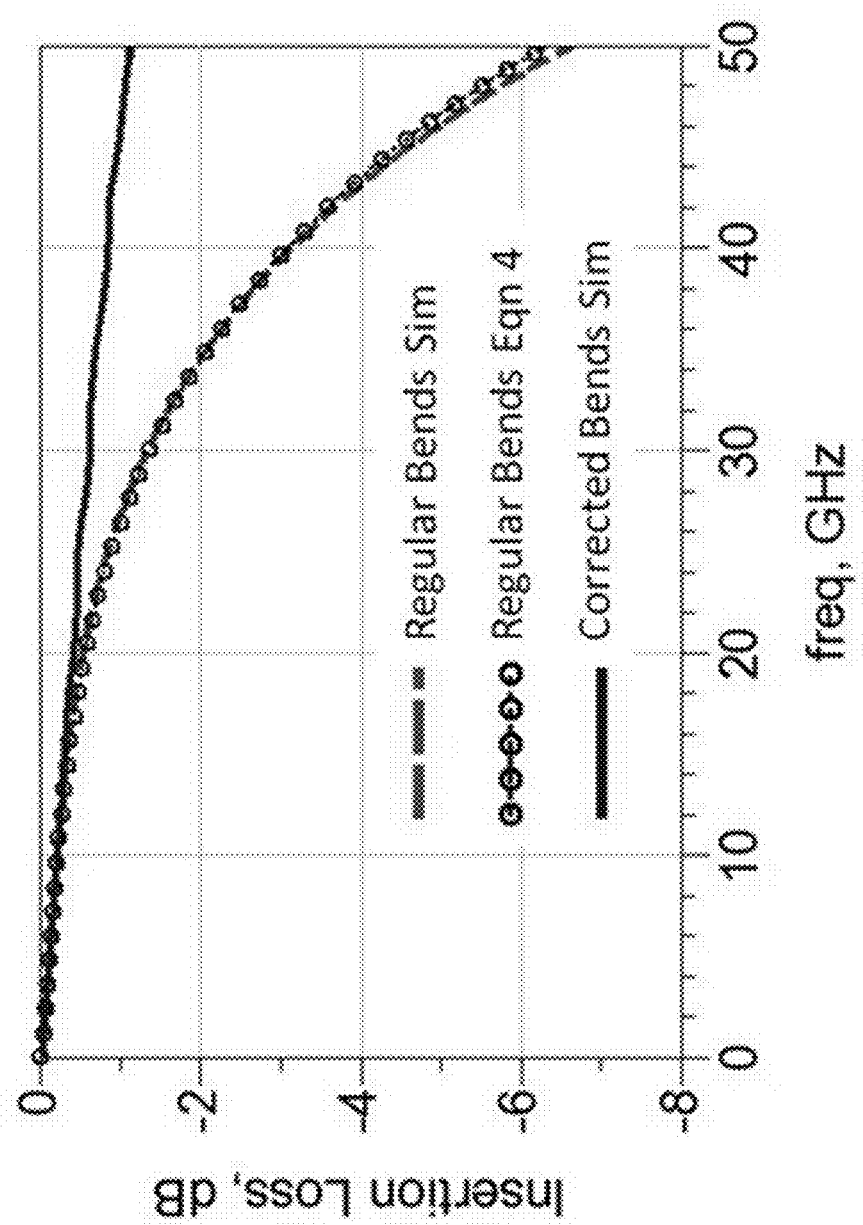
FIG. 3 shows a differential insertion loss plots.
Figure 4:
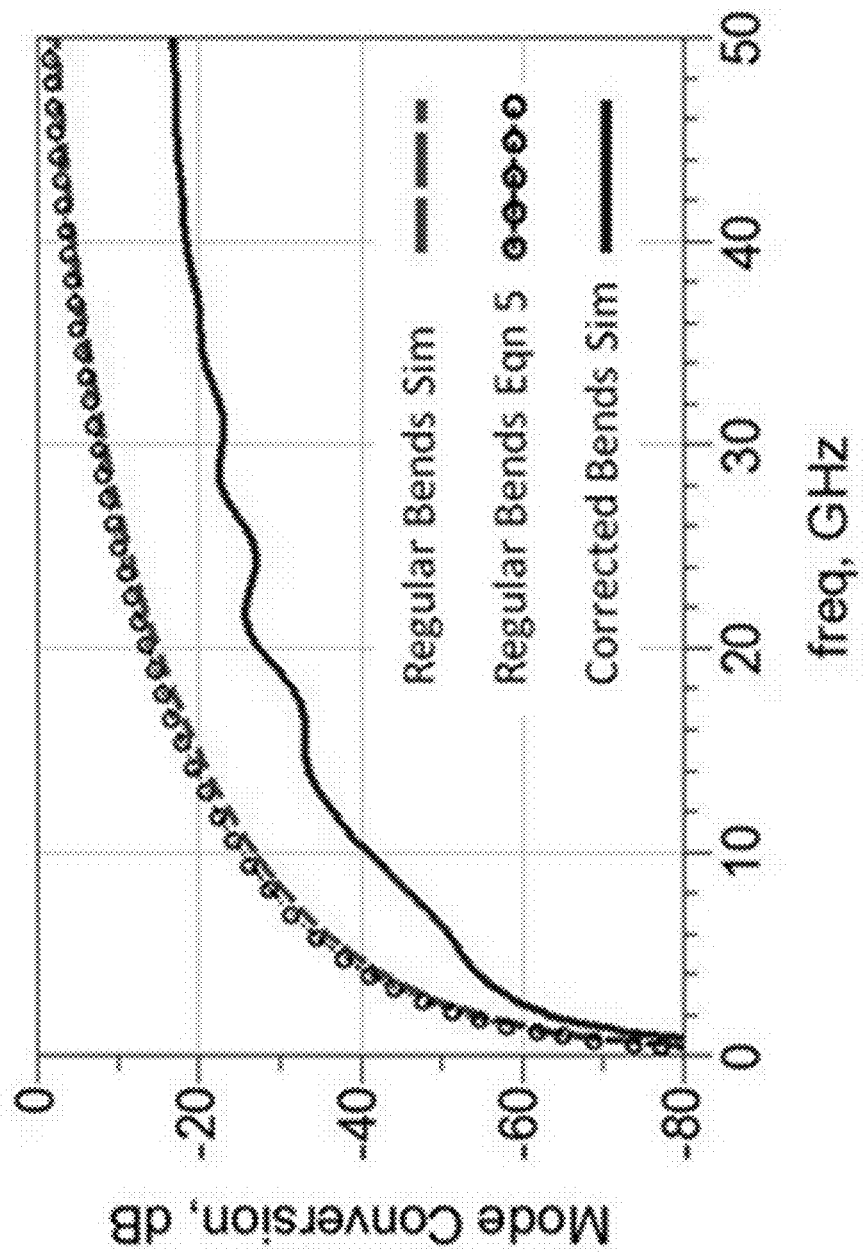
FIG. 4 illustrates conversion from differential to common mode.

FIG. 3 shows a differential insertion loss plots. Among other things, significant signal degradation can be noticed at high frequencies (e.g., 40 GHz and above) for the coupled lines with regular bends. The insertion loss is more than 6 dB at 50 GHz. In contrast, coupled lines with phase corrected bends have improved loss performance, exhibiting approximately 1 dB of loss at 50 GHz. FIG. 4 illustrates conversion from differential to common mode. As expected, a reduction of mode conversion by as much as 16 dB at 50 GHz is observed for the phase corrected bends compared to regular bends.

It is to be appreciated that the simulation data illustrated in FIGS. 3 and 4 are computed analytically using Equations (4) and (5) respectively for the coupled lines with regular bends. It is to be understood that the analytical insertion loss also includes straight line losses, such as ohmic and dielectric losses, in addition to the loss due to bends according to Equation (4). The straight line losses are computed from full wave electromagnetic simulation of straight coupled lines with identical line parameters and total lengths as was used in the case of the coupled lines with regular bends. It is to be appreciated that the agreement between analytically computed values and those obtained from full wave electromagnetic simulations is excellent over a wide band from DC to 50 GHz.

In addition to validation from computation, the implementation of phase correction is tested on actual device. More specifically, prototypes for both coupled lines with regular bends and with phase corrected bends shown in FIGS. 2(b) and 2(c) have been fabricated in a commercial substrate manufacturing house. In order to efficiently couple high frequency signals in and out of the coupled lines, launch structures compatible with GSGSG type on-wafer probing were integrated on both ends of the lines. Other features such as via shielding to quench substrate mode excitations were also added on all sides of the coupled lines at a reasonable distance.

Figure 5:
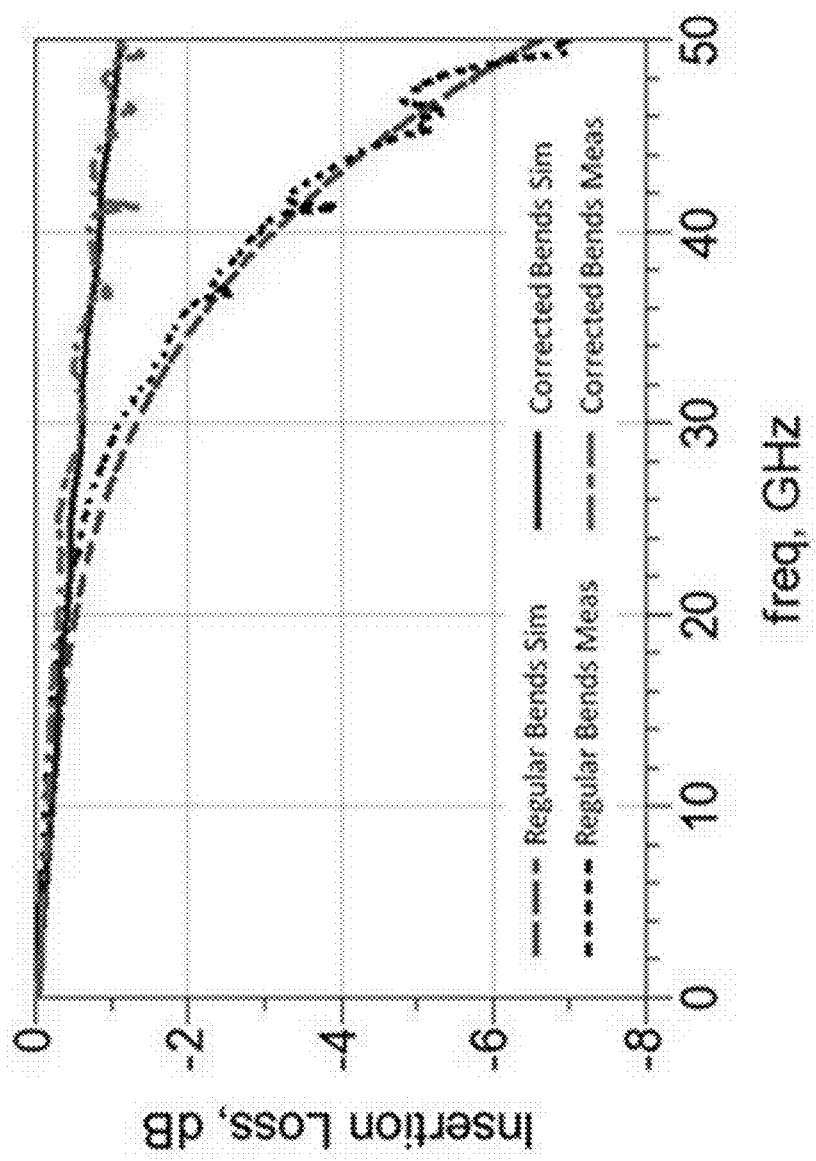
FIG. 5 shows measured differential insertion loss for regular and phase corrected bends as a function of frequency.
Figure 6:
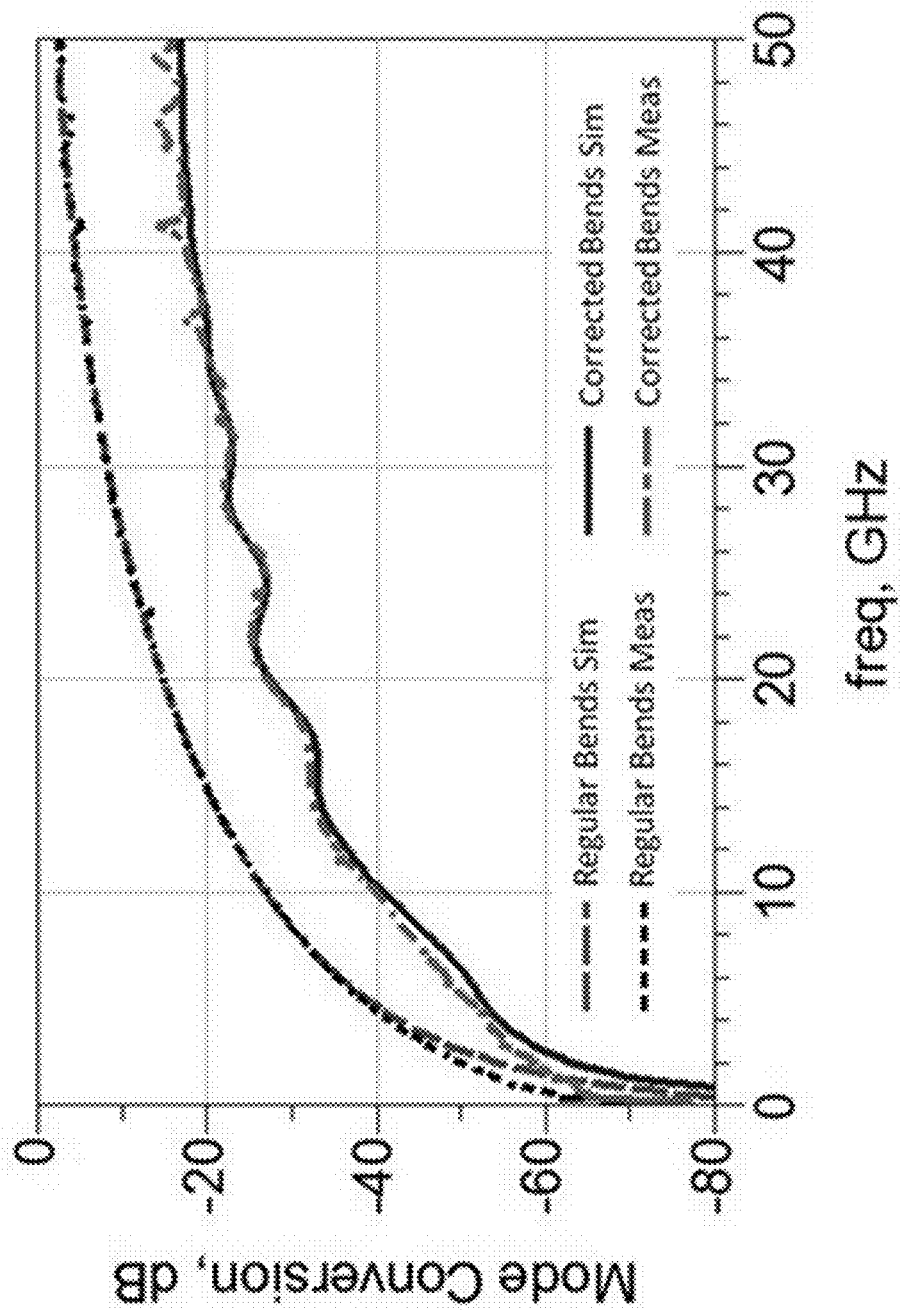
FIG. 6 shows measured differential to common mode conversion for regular and phase corrected bends as a function of frequency.

The measurements and characterization of the prototypes were performed in an on-wafer probing station equipped with a 4-port vector network analyzer (VNA). The scattering parameters obtained from the VNA were post-processed in a circuit simulator to compute differential insertion loss and mode conversion, which are plotted in FIGS. 5 and 6. Both the measured and computed data are plots in the graphs to allow easy comparison. More specifically, FIG. 5 shows measured differential insertion loss for regular and phase corrected bends as a function of frequency. FIG. 6 shows measured differential to common mode conversion for regular and phase corrected bends as a function of frequency. As FIGS. 5 and 6 show, the simulated data and the measured data are very close. For example, a few spikes in the measured insertion loss data at high frequencies indicate slight coupling and resulting energy loss to substrate modes. With measured insertion loss improvement of 6 dB and mode conversion reduction of 16 dB at 50 GHz, the effectiveness of the local phase correction technique is demonstrated.

Figure 7:
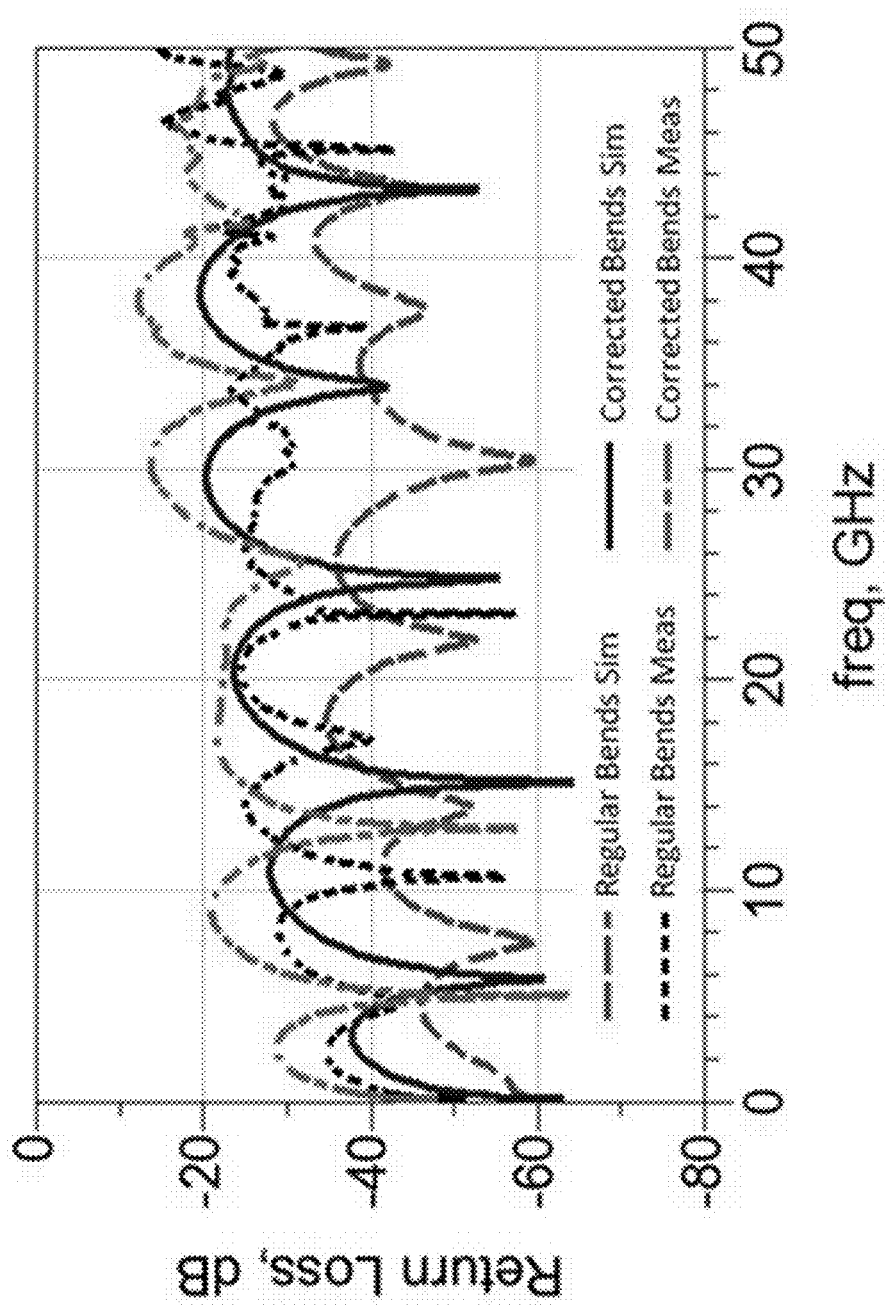
FIG. 7 illustrates measured and simulated return loss characteristics for regular and phase corrected bends as a function of frequency.

It is to be appreciated that the equations above provide a good model for insertion loss and mode conversion associated with correcting bending phase errors. Additional factors might be considered as well, such as impedance discontinuity caused by the bends, which is different from the assumption that the major contribution to signal degradation in coupled line bends comes from excess phase, not from impedance discontinuity. For impedance discontinuity to be a major contributor to signal degradation, the impedance discontinuity would need to significantly degrade return loss characteristics of the communication channel. FIG. 7 illustrates measured and simulated return loss characteristics for regular and phase corrected bends as a function of frequency. Among other things, FIG. 7 confirms low return loss observed for the phase corrected bends. Although degraded somewhat compared to regular bends, the return loss of corrected bends stayed below −20 dB to 25 GHz and below −10 dB to 50 GHz, a level better than what is typically acceptable in high speed systems.

Among other features, embodiments of the present invention provide a local phase correction method in which narrow coupled lines are offset placed inside the bends in such a way that leads to equal line lengths in the bend area. As can be seen from both simulation and actual testing data, the phase corrected bends according to embodiments of the present invention yield excellent performance over a wide frequency range (e.g., from DC to 50 GHz). At 50 GHz, insertion loss and mode conversion improved by more than 5 dB and 16 dB respectively, while return loss performance remained small and thus acceptable. Measured characteristics correlated well with those obtained using full wave simulations, and the simplified analytical theory.

Figure 8:
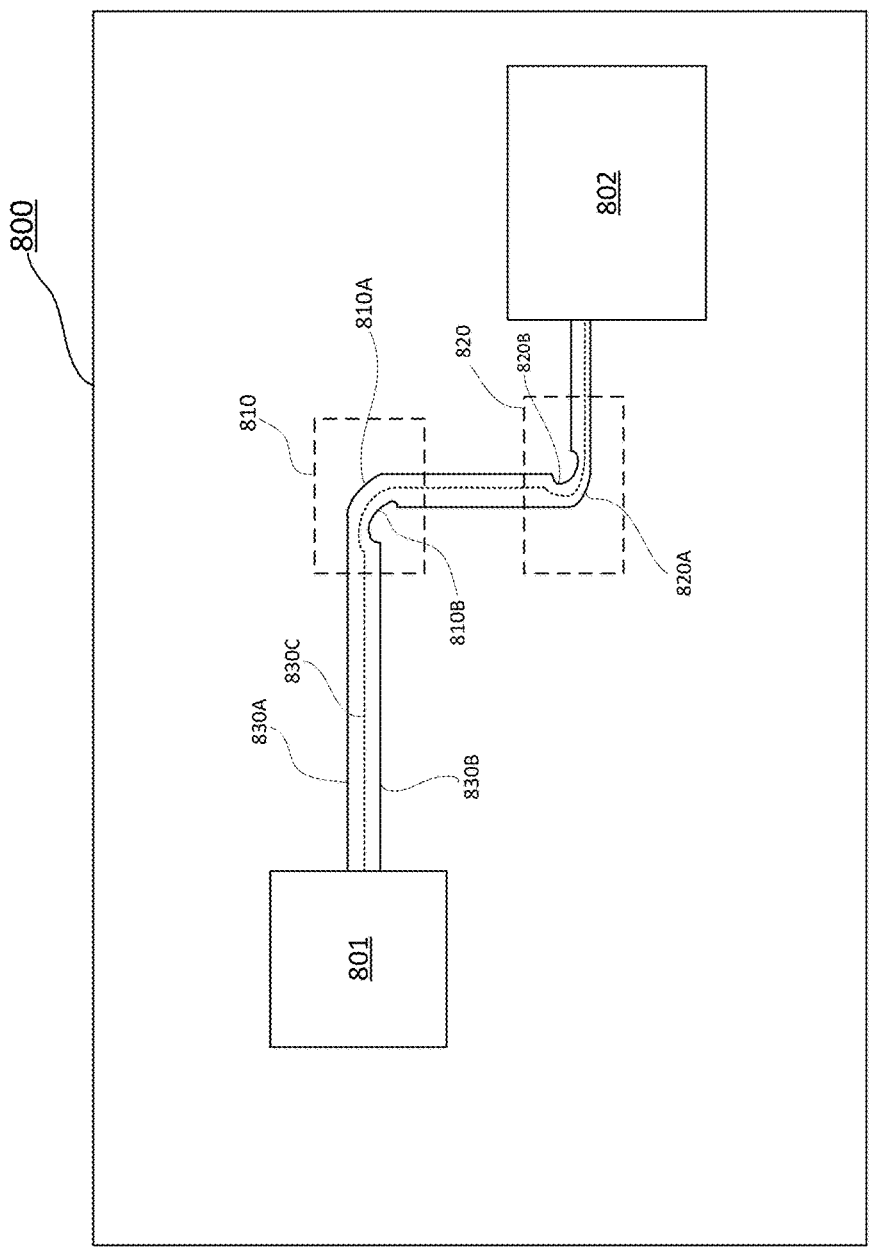
FIG. 8 is a simplified diagram illustrating an integrated circuit 800 with corrected bends according to an embodiment of the present invention.

FIG. 8 is a simplified diagram illustrating an integrated circuit 800 with corrected bends according to an embodiment of the present invention. This diagram is merely an example, which should not unduly limit the scope of the claims. One of ordinary skill in the art would recognize many variations, alternatives, and modifications. As shown in FIG. 8, an integrated circuit 800 includes a first component 801 and a second component 802. For example, both the first component 801 and the second component 802 are a part of the integrated circuit 800. In various embodiments, the integrated circuit 800 is manufactured using 45/40 nm (or smaller) processes. The lines 830A and 830B are physical communication links between the first component 830A and the second component 830B. Together, lines 830A and 830B form a single differential channel. Depending on the implementation, the lines 830A and 830B may operate in differential and/or common modes. For example, the lines 830A and 830B may be implemented as traces on a printed circuit board (PCB) or a package that is a part of the integrated circuit 800. According to various embodiments, the data rate of communication between the first component 801 and the second component 802 may be high (e.g., 10 Gbps or greater), which makes the local phase correction provided by embodiments of the present invention important. In FIG. 8, the lines 830A and 830B bend at region 810 and region 820. It is to be appreciated an integrated circuit (or package) may include line pairs with many more bends.

At region 810, the line 830A has an "outer bend" 810A, and the line 830B has an "inner bend" 810B. For example, the term "outer bend" refers to a line bend that is on the outside corner of a bend, and the term "inner bend" refers to a line bend that is on the inside corner of a bend. For example, portion 810A of the line 830A and portion 820A of the line 830B are both outer bends; portion 810B of the line 830B and the portion 820B of the line 830A are both inner bends. The geometry of the bends, as can be seen in FIG. 8, dictates that the line at the outer bend is longer than the line at the inner bend. That is, without compensation, the outer bend 810A would be longer than the inner bend 810B at the region 810, and the outer bend 820A would be longer than the inner bend 820B at region 820. It is thus to be appreciated that embodiments of the present invention provide a mechanism for providing local phase correction. More specifically, the shape of the inner bends 810B and 820B are specifically extended to respectively match the lengths of outer bends 810A and 820A. For example, the shape of the inner bends 810B and 820B are similar to the inner bends shown in FIG. 2a. By extending the length of the inner bends, the contour of the center line 830C is modified. For example, at region 810, the center line 830C has an offset bending it close to the outer bend 810A; at region 820, the center line 830C has an offset bending it to the outer bend 820A. As explained above, local phase for each of the lines and bends thereof are associated with lengths of the lines. At bend regions, line length at the outer bend region is typically shorter than the line length at the inner region, and the difference in length contributes to phase difference that causes errors. It is thus to be appreciated by matching the lengths of lines at the inner bend region and the outer bend region, as shown in FIG. 8, phases of lines at the bend region are matched and corrected, thereby reducing communication errors.

High-speed signals typically are very susceptible to changes in impedance level. Too much discontinuity in impedance level can impair the bandwidth to the extent that renders the system not function at all at high data rates. It is important that the geometrical parameters of 810A, 810B, 820A and 820B are chosen in a manner that the impedance level is compatible with 830A/830B. For example, the choice of these geometrical parameters may be dictated by manufacturing process technologies, component placements, routing and assembly constraints among others. In various implementations, the use of commercially available electromagnetic simulation and circuit analysis tools are all but necessary during the design phase to optimize these parameters to meet required system performance.

As explained above, in addition to the regions 810 and 820, lines 830A and 830B may have additional bends. In actual implementations, there may be a large number of IC components that communicate with one another using line pairs with bends, and one or more of these bends may need local correction as described according to embodiments of the present invention. For example, the integrated circuit 800 may selectively utilize local correction for bend regions of the line pairs, where the line pairs are used for high speed communication.

Figure 9:
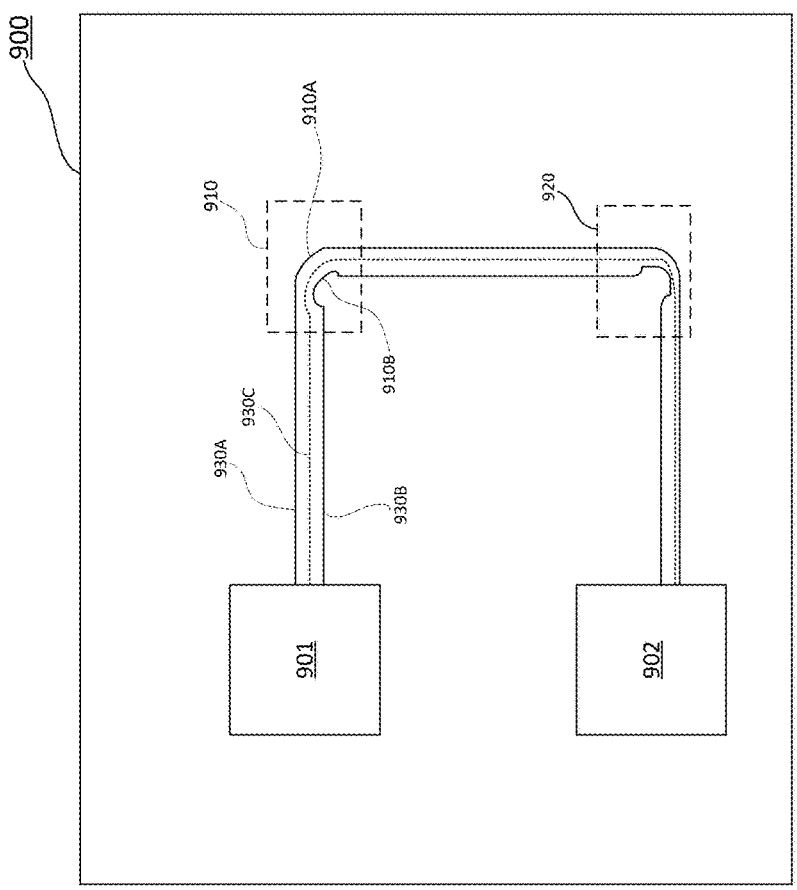
FIG. 9 is a simplified diagram illustrating an integrated circuit 900 with corrected bends according to an embodiment of the present invention.

FIG. 9 is a simplified diagram illustrating an integrated circuit 900 with corrected bends according to an embodiment of the present invention. This diagram is merely an example, which should not unduly limit the scope of the claims. One of ordinary skill in the art would recognize many variations, alternatives, and modifications. As shown in FIG. 9, an integrated circuit 900 includes a first component 901 and a second component 902. For example, both the first component 901 and the second component 902 are a part of the integrated circuit 900. As shown in FIG. 9, the integrated circuit 900 includes bend regions 910 and 920. The inner bends of the corresponding bend regions are extended, similar to those shown in FIG. 8, are extended to match the lengths of the outer bends. It is to be appreciated that depending on the implementation and actual configuration of bends and turns between two components that are connected to each with pair communication lines, the actual bend shapes and arrangements thereof vary accordingly.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An integrated circuit device comprising:
   a communication path connecting a first component and a second component positioned on the integrated circuit device, the communication path including a first line and a second line wherein:
   the communication path comprises a first bend region and a straight region;
   the first line and the second line are substantially parallel along the straight region;
   the first line and the second line are separated by a first distance at the straight region;
   the first line is shaped at the first bend region to match a length of the second line at the first bend region;
   the first line and the second line are separated by a second distance at the first bend region;
   the communication path is placed offset outward a centerline between the first line and the second line;
   the second distance is smaller than the first distance.

2. The device of claim 1 further comprising a second bend region, wherein the second line is shaped at the second bend region.

3. The device of claim 2 wherein the first line the second line are separated by a third distance at the second bend region, the third distance being smaller than the first distance.

4. The device of claim 1 wherein the first bend region is characterized by an insertion loss of less than 2 dB.

5. The device of claim 1 wherein the first bend region is characterized by a mode conversion of less than 10 dB.

6. The device of claim 1 where the first line is characterized by a first impedance value at the first bend region and characterized by a second impedance value at the straight region, the first impedance value being different from the second impedance value.

7. The device of claim 1 wherein the first line and the second line are characterized by a substantially equal width.

8. The device of claim 1 further comprising a single layer dielectric, the first line being positioned on the single layer dielectric.

9. The device of claim 8 further comprising a bottom metal layer serving as a ground plane for the first line and the second line.

10. The device of claim 1 wherein the first component is mounted on a PCB.

11. The device of claim 1 wherein the first line and the second line are differential lines.

12. The device of claim 1 wherein the first line and second line operate substantially in differential mode at the first bend region.

13. The device of claim 1 wherein the first line and second line are coupled transmission lines.

14. An integrated circuit device comprising:
    a first component;
    a second component;
    a communication path connecting the first component and the second component positioned on the integrated circuit device, the communication path including a first line and a second line wherein:
    the communication path comprises a first bend region and a straight region;
    the first line and the second line are substantially parallel along the straight region;
    the first line and the second line are separated by a first distance at the straight region;
    the first line and the second line are separated by a second distance at the first bend region;
    the communication path is placed offset outward a centerline between the first line and the second line;
    the second distance is smaller than the first distance.

15. The device of claim 14 wherein the first component is manufactured according to a 45 nm or smaller process.

16. The device of claim 14 wherein the communication path supports differential and common modes.

17. The device of claim 14 wherein the first line comprises a shaped region at the first bend region to provide phase correction.

18. An integrated circuit device comprising:
    a communication path connecting a first component and a second component positioned on the integrated circuit device, the communication path including a first line and a second line wherein:
    the communication path comprises a first bend region and a straight region;
    the first line and the second line are substantially parallel along the straight region;
    the first line and the second line are separated by a first distance at the straight region;
    the first line includes an inner bend region a the first bend region;
    the second line includes an outer bend region at the first bend region;
    the inner bend region is characterized by a first phase;
    the outer bend region is characterized by a second phase;
    the first line and the second line are separated by a second distance at the first bend region;
    the communication path is placed offset outward a centerline between the first line and the second line;
    the second distance is smaller than the first distance.

19. The device of claim 18 wherein the first phase and the second phase are substantially matched.

20. The device of claim 18 wherein the first line is shielded.

* * * * *